United States Patent [19]

Haisma et al.

[11] Patent Number: 5,425,848
[45] Date of Patent: Jun. 20, 1995

[54] METHOD OF PROVIDING A PATTERNED RELIEF OF CURED PHOTORESIST ON A FLAT SUBSTRATE SURFACE AND DEVICE FOR CARRYING OUT SUCH A METHOD

[75] Inventors: Jan Haisma; Martinus Verheijen; Johannes T. Schrama, all of Eindhoven, Netherlands

[73] Assignee: U.S. Philips Corporation, New York, N.Y.

[21] Appl. No.: 214,888

[22] Filed: Mar. 15, 1994

[30] Foreign Application Priority Data

Mar. 16, 1993 [EP] European Pat. Off. ............ 93200758

[51] Int. Cl.⁶ ............................ B44C 1/22; B29C 37/00
[52] U.S. Cl. ..................................... 216/48; 264/167; 425/363; 425/374; 216/54; 216/23; 216/44; 427/264; 430/313
[58] Field of Search ............ 156/630, 659.1, 660, 156/661.1, 668, 904, 658, 655; 430/296, 313, 314, 315, 316, 317, 318; 427/264; 425/363, 374, 808, 810; 264/167, 1.3

[56] References Cited

U.S. PATENT DOCUMENTS 4,543,225 9/1985 Beaujean .......................... 264/167
5,259,926 11/1993 Kuwabara et al. ............. 156/659.1

FOREIGN PATENT DOCUMENTS 354569 3/1991 Japan.

Primary Examiner—William Powell
Attorney, Agent, or Firm—John C. Fox

[57] ABSTRACT

A description is given of a method and a device (1) for providing (replicating) a patterned resyntetic resin relief (37) on the surface (25) of a glass substrate (27). For this purpose, a UV-curable acrylate lacquer (33) is applied to the surface (25), after which a transparent mould (3) having a relief (13) is rolled-off over the surface (25). By means of a UV light source (17) and an elliptic mirror (21), the lacquer is cured at the location of the focal line (23), thereby forming said relief (37). The relief (13) of the mould (3) is replicated on the glass substrate (27). The method described enables a relief of small dimensions (10×10 μm) to be seamlessly provided on a large fiat surface (1×1 m), without being hindered by large release forces.

24 Claims, 1 Drawing Sheet

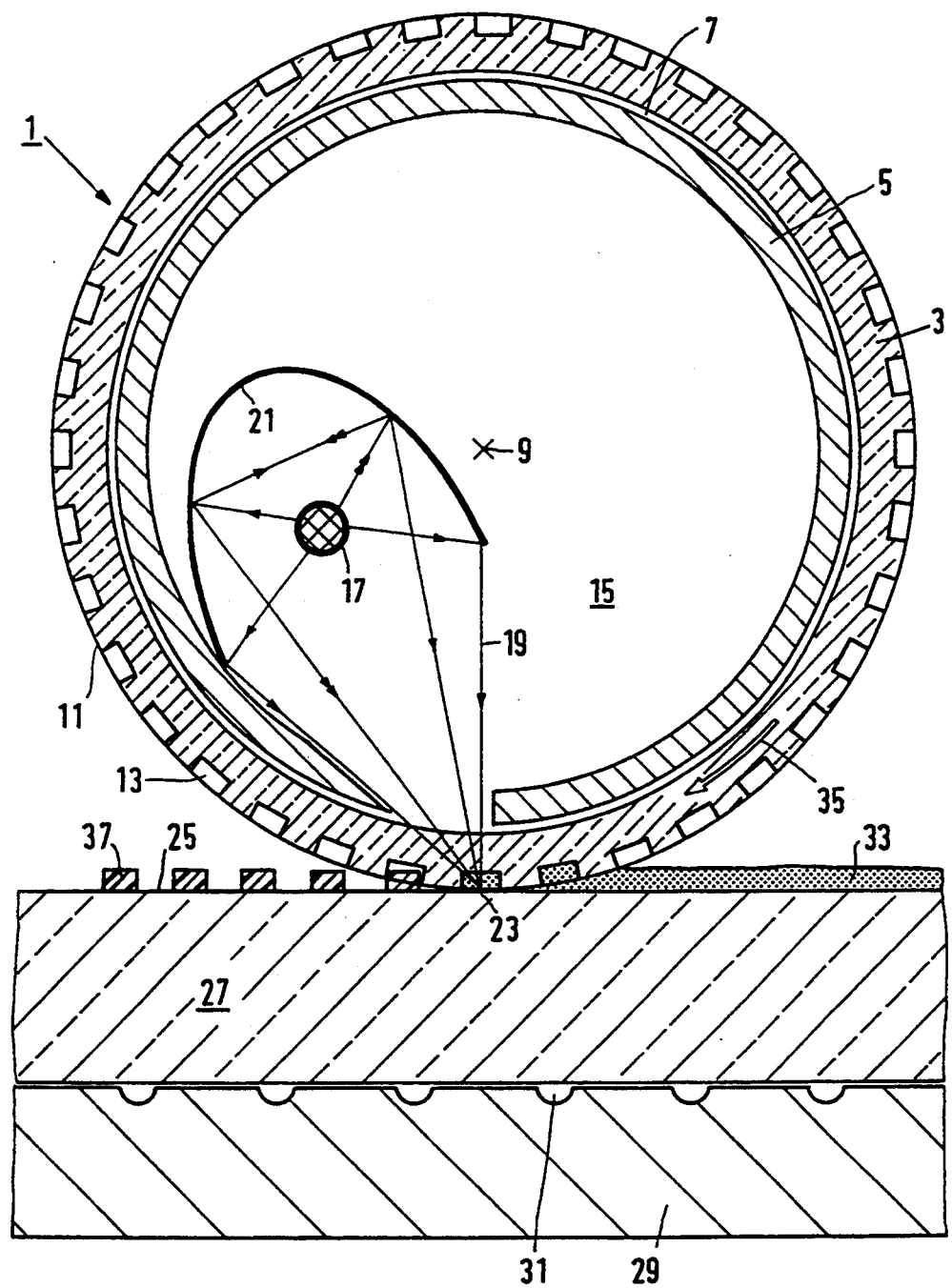

METHOD OF PROVIDING A PATTERNED RELIEF OF CURED PHOTORESIST ON A FLAT SUBSTRATE SURFACE AND DEVICE FOR CARRYING OUT SUCH A METHOD

BACKGROUND OF THE INVENTION

The invention relates to a method of providing a patterned relief of cured photoresist on a flat substrate surface, said substrate surface being provided with a layer of a UV-light curable liquid photoresist, after which said photoresist is brought into contact with a UV light-transparent mould having a relief which is complementary to the patterned relief to be provided and is subsequently cured by exposure to a UV-light source, thereby forming said patterned relief, after which the mould is removed from the cured relief.

The invention also relates to a device for carrying out such a method.

Such methods are used, for example, in the manufacture of flat screens for liquid crystal display devices (LCD and LC-TV) in which the patterned relief consists of the so-called black matrix between the colour filters. The method can also be used in the manufacture of patterned reliefs on screens of flat colour display tubes, such as flat cathode ray tubes and electron-fibre displays. Said method can further be used to provide a flat TV screen with a defined roughness in order to reduce reflections (anti glare).

Such a method is known from Patent Abstracts of Japan JP-A-3-54569. In the known method, a drop of liquid photoresist is provided between a flat substrate and a flat mould, said mould having a patterned relief in the form of recessed areas which are complementary to the relief to be provided in the form of protruding parts. The mould and the substrate are pressed together causing the photoresist to spread out over the entire substrate surface. The photoresist is cured by exposure to UV light, exposure taking place through the substrate or through the mould. After the photoresist has been cured, the mould is removed from the substrate, leaving the complementary pattern of the relief of the mould in cured photoresist on the substrate. In literature, this known method is referred to as replication. The protruding parts of the relief formed have dimensions of, for example, $10 \times 10$ $\mu$m. Cured photoresist is also present between the protruding parts of the cured relief, said photoresist must be removed by a uniform etching treatment.

The known method has a number of drawbacks. The known method is unsuitable for providing a relief pattern on large surfaces of, for example, $1 \times 1$ m; it is limited to dimensions of maximally $30 \times 30$ cm. At larger dimensions, detaching the mould from the cured photoresist becomes problematic owing to the action of large adhesive forces. Despite the use of a release agent, the release of large surfaces requires substantial forces, so that the substrate and/or mould may become damaged. A flexible substrate and/or mould can be more readily released, however, frequently flexible substrates and/or moulds are impossible or undesired, for example, to attain a reproducible precision. To provide larger surfaces with a relief, in principle, said relief can be built up of a number of juxtaposed replicated surfaces. However, said method has the disadvantage that the replicated surfaces must be accurately juxtaposed to avoid the formation of visible seams caused by misfitting contiguous reliefs. A further drawback of the known method is the risk that air bubbles are included in the liquid photoresist when the mould and the substrate are arranged on top of each other. This risk increases with the dimensions of the surfaces to be replicated. A further drawback of the known method is the above-mentioned necessary etching treatment to which the cured photoresist must be subjected in order to remove the photoresist between the protruding parts of the relief.

OBJECTS AND SUMMARY OF THE INVENTION

It is an object of the invention to provide, inter alia, a method which does not have the above drawbacks and which can suitably be used to seamlessly replicate relief patterns of, for example, $10 \times 10$ $\mu$m on surfaces of $1 \times 1$ m. The invention also aims at providing a device for carrying out such a method.

The object of providing such a method is achieved according to the invention by a method as described in the opening paragraph, which is characterized in that the mould used is a hollow circle-cylindrical mould which rotates about its cylinder axis, the outside of the cylinder surface being provided with the relief and the cylinder axis extending parallel to the substrate surface, the interior of the mould being provided with an elliptic mirror having a first and a second focal line, said focal lines extending parallel to the substrate surface and the first focal line coinciding with the longitudinal axis of the UV light source, and the second focal line coinciding with a tangent of the mould to the substrate surface, so that the photoresist is cured at the location of the second focal line, thereby forming a part of the patterned relief, while the substrate surface is kept in non-slip contact with the rotating mould. According to the invention, the UV light-transparent mould is formed by a hollow cylinder having a circular perpendicular section. The outside of the cylinder surface is provided with a patterned relief which corresponds, in complementary form, to the relief to be provided on the substrate. Said relief may be provided as a recessed portion in or a raised portion on the cylinder surface. The cylindrical mould is placed on the substrate surface in such a manner that the cylinder axis extends parallel to the surface. The cylindrical mould is rolled along the substrate surface in a non-slip manner. This can be achieved by driving the cylindrical mould or by linearly moving the substrate surface, so that the cylindrical mould is rotated by frictionally contacting the substrate to surface. The substrate is provided with a layer of a liquid photoresist which has the property that it can be cured by exposure to UV light. The interior of the cylindrical mould is provided with an elliptic mirror having two focal lines which extend parallel to the cylinder axis. At the location of one of the focal lines there is positioned an elongated UV light source whose light is focused to the second focal line by the mirror. The second focal line coincides with the tangent of the cylindrical mould to the substrate surface. During the rotation of the mould along the substrate surface, the tangent moves along the substrate surface in a direction parallel to the cylinder axis. During the rotation of the mould along the substrate surface the light source and the elliptic mirror remain fixed with respect to said moving tangent. Due to the focused exposure to UV light, the photoresist is cured at the location of the tangent. The cured photoresist bonds to the substrate surface and becomes detached from the rotating mould. As the release in accordance with the method of the invention only has to take place along a very narrow surface area, the necessary release forces are much smaller than in the case of flat moulds. By virtue of the very narrow contact surface between the mould and the substrate the risk of inclusion of air bubbles in the liquid photoresist and the inclusion of air between the mould and the lacquer are minimal because during the pressing together of the mould and the substrate any air bubbles are pushed aside into the liquid photoresist. During rotation of the mould, the pattern is transferred to the flat substrate. In a typical example, the relief consists of rows of blocks of cured photoresist having dimensions of $10 \times 10$ μm and a thickness of 2 μm, the distance between the blocks being 10 μm. At substrate dimensions of $1 \times 1$ m, the length of the cylindrical mould is approximately 1 m and the outside diameter is approximately 0.3 m, if the mould rolls once along the substrate. In accordance with this method, a seamlessly replicated surface of large dimensions ($1 \times 1$ m) having a relief of very small dimensions ($10 \times 10$ μm) is obtained.

For the photoresist use can be made of many known UV-curable photoresists, such as those on the basis of epoxies and acrylates. Very suitable photoresists are di- and triacrylates with which a crosslinked and hence hard polymer network is formed. Acrylates rapidly cure at room temperature by exposure to UV light. Examples are 1,6-hexanediol diacrylate, tripropyleneglycol diacrylate, bis(2-hydroxyethyl)bisphenol-A-dimethacrylate and trimethylolpropane triacrylate. The photoresist also comprises a few per cent by weight of a suitable photoinitiator, such as $α,α$-dimethoxy-$α$-phenylacetophenone.

To irradiate the photoresist, use can be made of one or more UV fluorescent lamps or high-pressure mercury-vapour lamps which, dependent on the photoinitiator used, emit UV light in a wavelength range of, for example, approximately 360 nm.

The material of the transparent cylindrical mould may be glass or synthetic resin, such as PMMA. However, in order to attain a high precision and a satisfactory reproducibility, the mould is preferably made from a material having a low linear coefficient of thermal expansion (TEC). In operation, the temperature of the mould is increased by a few degrees by the UV light source in a typical example, the required dimensional accuracy is $1:10^5$ (namely 10 μ over 1 m). To maintain this accuracy, the TEC of the material of the mould is maximally $10^{-6}/°$ C. A suitable material for the mould is, for example, fused silica which has a TEC of $5.10^{-7}/°$ C. This material can be obtained from several manufacturers, tier example Schott under the trade name Homosil ™.

Other suitable materials for the mould are, tier example, glass ceramics, such as Zerodur ™ by Schott, and ULE ™ (ultra-low expansion glass) by Corning. Both materials have a very low TEC of $5.10^{-8}/°$ C. and are transparent to near-UV light ($λ > 300$ nm).

A particular embodiment of the method in accordance with the invention is characterized in that the mould is rotated once 360° C. This means that the periphery of the cylindrical mould comprises, in a complementary form, the complete relief to be provided. Such a mould enables a seamless pattern of cured photoresist to be provided on the substrate.

Preferably, the mould is provided with a release agent, so that the cured photoresist can be detached from the mould more easily during the replication process. For the release agent use can be made of agents which are known per se, such as the following types of silanes: trimethylchlorosilane, trimethylsilyldiethylamine and trimethylmethoxysilane. These silanes comprise reactive groups which react with the—Si-OH groups of the surface of the mould, thereby forming covalently bonded —SiO—Si(CH$_3$)$_3$ groups on the mould surface. These groups shield the surface of the mould from the photoresist. It is alternatively possible to use other alkylsilanes instead of methylsilanes. The mould surface can be silanated in a customary manner from the vapour phase or from the liquid phase. For the release agent use can alternatively be made of higher fatty acids, such as octadecyl acid.

Preferably, the substrate surface, which is generally a glass surface, is provided with an adhesion promotor for photoresist. For the adhesion promotor for the photoresist many agents which are known per se can be used, such as silanes. If an acrylate is used as the photoresist, said silane comprises an acrylate group and a group which reacts with —Si-OH groups of the glass surface, such as an alkoxy group and a halogen atom. The photoresist is covalently bonded to the glass surface via the —Si-O-Si—bond. Examples of suitable bonding silanes for acrylate-containing photoresists are 3-(methacryloxy)propyltrimethoxysilane and 3-(methacryloxy)propyltrichlorosilane. If the photoresist comprises epoxies or polyesters, silanes having an epoxy group are used.

The method in accordance with the invention is very suitable for providing a patterned relief on a passive plate of a liquid crystal display device (LCD and LC-TV). In such an LC device, the passive plate comprises red, green and blue colour filters which are provided in accordance with a pattern. In order to improve the contrast between the colour filters, a light-absorbing grating, the so-called "black matrix", is often provided between the colour filters. Said grating often consists of black dye or metal, such as chromium or nickel. By means of the method in accordance with the invention, a light-absorbing grating is obtained by providing photoresist in accordance with a pattern on a thin layer of, for example, a black dye or a metal film, after which the non-coated parts of the dye or metal layer are removed by etching.

The method in accordance with the invention can also be used to provide the colour-filter pattern itself.

The method can further be used in the manufacture of patterned reliefs on screens of fiat colour display tubes, such as fiat cathode ray tubes and electron fibre displays. The method can also be used for providing a flat TV screen with a defined roughness in order to decrease reflections (anti glare).

The invention also relates to a device for providing a patterned relief of cured photoresist on a flat surface of a substrate and is characterized in that the device comprises a hollow cirle-cylindrical mould which can be rotated about its cylinder axis and which is transparent to UV light, the outside of the cylinder surface being provided with a relief which is complementary to the patterned relief to be provided, the interior of the mould being provided with at least one UV light source as well as means for focusing the UV light to a line extending parallel to the cylinder axis and coinciding with the relief, and the device also comprising a substrate carrier having means for securing the substrate and/or closely contacting the substrate surface and the rotatable mould, at least during exposure, in such a manner that the substrate surface and the mould are capable of performing a rolling movement one relative to the other.

In a suitable embodiment of the device, the means for focusing UV light comprise an elliptic mirror. As explained above, the light source is present in the one focal line of the elliptic mirror, whereas the other focal line coincides with the tangent of the relief of the periphery of the cylindrical mould to the substrate. Both focal lines extend parallel to the cylinder axis.

Preferably, the means for securing the substrate consist of channel-shaped apertures which terminate at the surface of the substrate carrier, said apertures being in communication with a vacuum pomp. During the replication process, the substrate remains immovably connected to the substrate career. The substrate is mechanically or pneumatically pressed against the cylindrical mould via the substrate career, so that the substrate and the mould are capable of performing a rolling movement one relative to the other without slipping.

During the replication process, the cylindrical mould rotates around the UV light source and the mirror and is for example, suspended from an air bearing having a high tilt stiffness, which is known per se.

Such a device also enables a cylindrical mould to be manufactured on the basis of a flat mother mould. A flat glass plate in which the desired patterned relief is photolithographically provided is arranged on the substrate carrier. The relief is provided with a release layer. Said glass plate serves as the mother mould and is provided with a layer of a UV-curable photoresist. This relief of the mother mould is transferred as follows to the periphery of a UV-light transparent hollow cylinder. In the initial state, the surface of the periphery of the cylinder is smooth and is provided with a bonding layer for photoresist. The photoresist is cured at the location of the tangent of the cylinder to the mother mould by exposure to the UV light source via the elliptical mirror in the hollow cylinder. The rotation of the cylinder causes the cured photoresist to become detached from the mother mould and bond to the circumferential surface of the cylinder. After one complete rotation of the cylinder, the complementary relief of the mother mould is transferred to the cylinder. The cylinder with the relief of cured photoresist is etched, for example, by means of reactive ion etching (RIE) in, for example, a fluorine-containing plasma to remove the cured photoresist and form a recessed relief in the material of the cylinder. The relief can also be provided on the cylinder by laser engraving. The materials used for the cylinder, photoresist, adhesion promotor and release layers are the same as those mentioned above. The thus manufactured cylinder having the relief at the periphery is used as a mould in the method and device in accordance with the invention.

BRIEF DESCRIPTION OF THE DRAWING

The invention will be explained in greater detail by means of an exemplary embodiment and a drawing, in which the sole Figure is a diagrammatic sectional view of a device for carrying out the method in accordance with the invention.

DESCRIPTION OF THE PREFERRED EMBODIMENTS

Exemplary embodiment

In the Figure, reference numeral 1 represents a diagrammatic cross-sectional view of a device for carting out the method in accordance with the invention. The essential components of the device consist of a cylindrical mould 3 of ULE TM (ultra-low expansion glass) available from the firm of Coming. This material has a very low TEC of $5.10^{-8°}$ C. and a transparent to near-UV light. The length of the cylinder 3 is 1 m and the outside diameter is 31 cm. The cylinder 3 is rotatable about an axis (not shown) having a high tilt stiffness and is suspended from a metal air bearing 5. An air gap 7 which is filled with air of increased pressure is present between the mould 3 and the bearing 5. The axis is rotatable about the geometrical axis 9. The outer circumference 11 of the cylinder 3 is provided with a patterned recessed relief 13 which consists of juxtaposed rows of square recessed portions having dimensions of $10 \times 10$ m and a depth of 2 $\mu$m. The relief is provided with a released layer (not shown) of trimetylchlorosilane. The interior 15 of the cylinder 3 is provided with an elongated UV fluorescent lamp 17 which is arranged in the first focal line of an elliptic mirror 21. The UV light 19 having a wavelength of approximately 350 nm emitted by the UV light source, is focused by the mirror 21 to the second focal line 23 of the mirror. Both focal lines are parallel to the axis 9 of the cylinder. Focal line 23 coincides with the outer circumference 11 of the cylinder 3. Focal line 23 is so positioned by the mirror that it coincides with the tangent to the outer circumference 11 and the surface 25 of a glass substrate 27. The substrate 27 has dimensions of $1 \times 1$ m and a thickness of 5 mm. The surface 25 of the substrate 27 is provided with a layer (not shown) of 3-(methacryloxy)-propyl trimethoxysilane (A 174 by Ventron) as an adhesion promotor. The substrate 27 is arranged on a steel substrate carner 29 and is secured thereto by an underpressure at the location of the outlets 31 of channels (not shown) in the substrate career 29. The channels are connected to a vacuum pomp (not shown). Substrate 27 is pressed against the mould 3 via the substrate carrier 29, so that the mould 3 can rotate over the substrate surface 25 in a non-slip manner. A layer 33 of a UV-curable liquid photoresist is applied to the surface 25 of the glass substrate 27. For the photoresist, use is made of Dacryl 101 TM (a bisphenol A di-methacrylate) manufactured by Akzo Chemie, to which 3% by weight of a photoinitiator (Irgacure 651 TM by Ciba Geigy) is added. The photoresist is cured at the location of the tangent 23 under the influence of UV light. An impression 37 of cured photoresist on the substrate surface 25 is/brined by the rotating movement of the mould 3 in the direction of the arrow 35. The impression 37 is complementary to the relief 13 of the mould 3. After one complete rotation of the mould, the patterned relief 13 of the mould is transferred onto the substrate surface 25 in the form of a relief of cured photoresist 37. By virtue of the very small contact surface between the mould 3 and the substrate 27, the release forces required during the replication process are much smaller than in the case of a flat mould. A patterned relief 37 is very accurately provided on the flat substrate surface 25. The method in accordance with the invention enables a patterned relief of small dimensions ($10 \times 10$ $\mu$m) to be very accurately provided on large surfaces, the necessary release forces being very small.

We claim:

1. A method of providing a patterned relief of cured photoresist on a flat substrate surface, the substrate surface being provided with a layer of a UV-light curable liquid photoresist, after which the photoresist is brought into contact with a UV light-transparent mould having a relief which is complementary to the patterned relief to be provided and which is subsequently cured by exposure to a UV light source, thereby forming the patterned relief, after which the mould of the cured relief is removed, characterized in that a hollow circular-cylindrical mould which rotates about its cylinder axis is used as the mould, the outside of the cylinder surface being provided with the relief and the cylinder axis extending parallel to the substrate surface, the interior of the mould being provided with an elliptic mirror having a first and a second focal line, said focal lines extending parallel to the substrate surface and the first focal line coincided with the longitudinal axis of the UV light source, and the second focal line coinciding with a tangent of the mould to the substrate surface, so that the photoresist is cured at the location of the second focal line, thereby forming a part of the patterned relief, while the substrate surface is kept in non-slip contact with the rotating mould.

2. A method as claimed in claim 1, characterized in that the mould is formed from material having a linear coefficient of thermal expansion of maximally $10^{-6}/°$ C.

3. A method as claimed in claim 2, characterized in that the material of the mould is formed from fused silica, a glass ceramic or glass having a low coefficient of expansion.

4. A method as claimed in claim 1, characterized in that the mould makes one complete rotation.

5. A method as claimed in claim 1, characterized in that the mould is provided with a release agent.

6. A method as claimed in claim 1, characterized in that the substrate is provided with an adhesion promotor for photoresist.

7. A method as claimed in claim 1, characterized in that a passive plate of a liquid-crystal display device is used as the substrate.

8. A device for providing a patterned relief of cured photoresist on a flat surface of a substrate, comprising a hollow circle-cylindrical, UV-light-transparent mould which can be rotated about its cylinder axis, the outside of the cylinder surface being provided with a relief which is complementary to the patterned relief to be provided, the interior of the mould being provided with at least one UV light source as well as means for focusing the UV light to a line extending parallel to the cylinder axis and coinciding with the relief, and the device also comprising a substrate carrier having means for securing the substrate and the closely contacting, at least during exposure, the substrate surface and the rotatable mould, in such a manner that the substrate surface and the mould can be rolled off with respect to each other.

9. A device as claimed in claim 8, in which the means for focusing UV light comprise an elliptic mirror.

10. A device as claimed in claim 8, in which the means for securing the substrate consists of channel-formed apertures in the substrate carrier, which apertures are in communication with a vacuum pomp.

11. A method as claimed in claim 2, characterized in that the mould makes one complete rotation.

12. A method as claimed in claim 3, characterized in that the mould makes one complete rotation.

13. A method as claimed in claim 2, characterized in that the mould is provided with a release agent.

14. A method as claimed in claim 3, characterized in that the mould is provided with a release agent.

15. A method as claimed in claim 4, characterized in that the mould is provided with a release agent.

16. A method as claimed in claim 2, characterized in that the substrate is provided with an adhesion promotor for photoresist.

17. A method as claimed in claim 3, characterized in that the substrate is provided with an adhesion promotor for photoresist.

18. A method as claimed in claim 4, characterized in that the substrate is provided with an adhesion promotor for photoresist.

19. A method as claimed in claim 5, characterized in that the substrate is provided with an adhesion promotor for photoresist.

20. A method as claimed in any claim 2, characterized in that a passive plate of a liquid-crystal display device is used as the substrate.

21. A method as claimed in any claim 3, characterized in that a passive plate of a liquid-crystal display device is used as the substrate.

22. A method as claimed in any claim 4, characterized in that a passive plate of a liquid-crystal display device is used as the substrate.

23. A method as claimed in any claim 5, characterized in that a passive plate of a liquid-crystal display device is used as the substrate.

24. A method as claimed in any claim 6, characterized in that a passive plate of a liquid-crystal display device is used as the substrate.

* * * * *